United States Patent
Lattimore et al.

[11] Patent Number: 6,058,065
[45] Date of Patent: May 2, 2000

[54] MEMORY IN A DATA PROCESSING SYSTEM HAVING IMPROVED PERFORMANCE AND METHOD THEREFOR

[75] Inventors: George McNeil Lattimore, Austin; Terry Lee Leasure, Georgetown; Robert Anthony Ross, Jr., Cedar Park; Gus Wai-Yen Yeung, Austin, all of Tex.

[73] Assignee: International Business Machines Corporation, Armonk, N.Y.

[21] Appl. No.: 09/082,540

[22] Filed: May 21, 1998

[51] Int. Cl.⁷ .................................................. G11C 8/00
[52] U.S. Cl. ...................................... 365/230.03; 365/63
[58] Field of Search ............................ 365/230.03, 190, 365/149, 185.13, 185.11, 63, 52, 72

[56] References Cited

U.S. PATENT DOCUMENTS

| | | | |
|---|---|---|---|
| 5,051,954 | 9/1991 | Toda et al. | 365/230.03 |
| 5,422,853 | 6/1995 | Miyamoto | 365/205 |
| 5,499,215 | 3/1996 | Hatta | 365/230.03 |
| 5,561,626 | 10/1996 | Fujii | 365/230.03 |
| 5,570,319 | 10/1996 | Santoro et al. | 365/230.03 |
| 5,652,726 | 7/1997 | Tsukude et al. | 365/230.03 |
| 5,862,095 | 1/1999 | Takahashi et al. | 365/230.03 |

FOREIGN PATENT DOCUMENTS 61-90393 of 0000 Japan .

OTHER PUBLICATIONS

IBM Technical Disclosure Bulletin, vol., 30, No. 5, Oct. 1987, pp. 378–379.

*Primary Examiner*—Tan T. Nguyen
*Attorney, Agent, or Firm*—Winstead Sechrest & Minick P.C.; Anthony V. S. England

[57] ABSTRACT

A memory array is modified by segmenting the total length of a bitline into smaller bitline sections referred to as local bitlines. Included is an additional bitline into the array for every bitline that has been segmented. This new bitline is referred to as the global bitline. After segmentation, the array appears as several smaller sub-arrays; each sub-array has fewer cells per segmentation (local bitline) than the sum total of cells along the more traditional non-segmented bitline approach. These smaller sub-arrays (local bitline segmentations) are independent of one another and only one sub-array can be accessed per memory request (read/write). The reduced length and cell count per local bitline within each sub-array substantially reduces the total bitline capacitance (e.g., diffusion capacitance) discharged by a single memory cell during a read operation. Reducing bitline capacitance results in faster signal development and restore time on the bitline; thus, several smaller sub-arrays can be cycled much faster than a single large array.

14 Claims, 4 Drawing Sheets

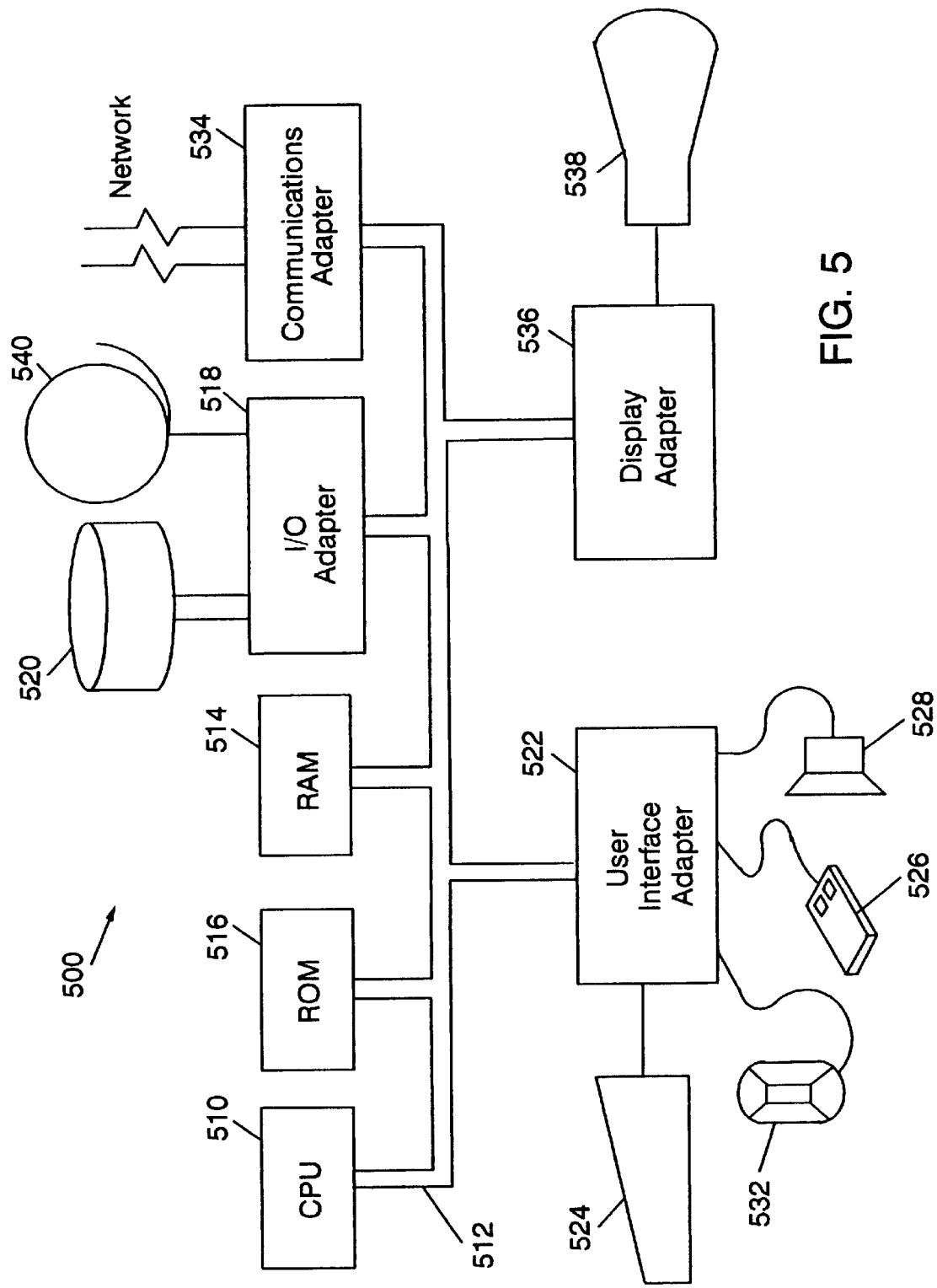

MEMORY IN A DATA PROCESSING SYSTEM HAVING IMPROVED PERFORMANCE AND METHOD THEREFOR

CROSS-REFERENCE TO RELATED APPLICATIONS

Related subject matter may be found in the following commonly assigned, co-pending U.S. patent applications, both of which are hereby incorporated by reference herein:

Ser. No. 08/904,987 (Attorney Docket AT9-97-311) filed Aug. 1, 1997 (AT9-97-311), entitled "BIT LINE DOMINO BOOST AMPLIFIER" and filed concurrently herewith; and Ser. No. 08/905,000 (Attorney Docket No. AT9-97-312) filed Aug. 1, 1997 (AT9-97-312), entitled "BIT LINE BOOST AMPLIFIER" and filed concurrently herewith.

TECHNICAL FIELD

The present invention relates in general to data processing systems, and in particular, to memories within the data processing systems.

BACKGROUND INFORMATION

As technology advances, memories in semiconductor devices have become larger and more advanced. While such large, compact memories provide the functionality required for current data processing systems, these memories have also stretched manufacturing and design technology limits. For example, as memories have become more dense, the memory cells themselves have become considerably smaller. As dimensions decrease, the difficulties associated with manufacturing functioning devices increases. Furthermore, as memories become larger, more cells are disbursed along conductors within the memory, thus increasing capacitive loading in a manner that adversely affects the functionality of the device. To understand the issues associated with larger memories, a description of a typical semiconductor memory will be provided below.

A semiconductor memory typically includes a memory cell array that has a grid of bitlines and wordlines, with memory cells disposed at intersections of the bitlines and wordlines. During operation, the bitlines and wordlines are selectively asserted or negated to enable at least one of the memory cells to be read or written. Furthermore, one type of semiconductor memory cell array is a differential signal memory array. In traditional differential signal memory arrays, a 6-device memory cell is utilized. In the 6-device memory cell, four transistors are configured to form a cross-coupled latch or a memory cell for storing data. The remaining two transistors are used to obtain access to the memory cell. During a "read" access, differential data stored within the memory cell is transferred to an attached bitline pair. Differential voltage is allowed to develop on the bitlines until there is sufficient offset between bitlines to reliably sense the binary state of the memory cell. Such an offset is typically in the range of 100–200 millivolts. With the completion of the read access, the differential bitline pairs are clamped together and restored to a "high" logic level voltage to cancel an offset generated during the read operation.

Conversely, during a "write" access, data is written into the memory cell through the differential bitline pair. In general, one side of the bitline pair is driven to a logic low level potential and a remaining side of the differential pair is driven to a high voltage level less a threshold voltage of the transistor. Following the write access, the differential bitline pair is typically restored to a high logic level voltage prior to a next read or write access to the memory cell. For a traditional memory array, the time required for a sufficient bitline offset development to reliably read the memory cell, in addition to the time required to restore one-half of the differential bitline pair ground potential to the logic high voltage after a write operation, defines a minimum cycle time for the array.

Improvements to either a bitline offset development rate, or a bitline restore time following a write access, increase performance of the memory structure as a whole. However, in a large memory array which typically includes an array organized in long column bitlines, together with many rows, the length of an array bitline limits the improvements that may be accomplished.

Thus, increasing demands for larger memories have driven increases in bitline length and loading as memory designers place additional cells along a bitline within a memory array to implement denser memory arrays. The additional length of the bitline (referred to as wire length) and device count per bitline add wire and diffusion capacitance to an already highly capacitive environment. As previously set forth, additional time is then required to charge and discharge this extra capacitance. Such additional time equates to increased read and write access times and increased cycle times, and, therefore, to slower performance.

Therefore, a need exists for a semiconductor memory that allows additional cells to be placed along a bitline in a memory array, while preserving performance of the memory system.

SUMMARY OF THE INVENTION

The present invention modifies a memory array by segmenting the total length of a bitline into smaller bitline sections referred to as local bitlines. Included is an additional bitline into the array for every bitline that has been segmented. This new bitline is referred to as the global bitline. After segmentation, the array appears as several smaller sub-arrays; each sub-array has fewer cells per segmentation (local bitline) than the sum total of cells along the more traditional non-segmented bitline approach. These smaller sub-arrays (local bitline segmentations) are independent of one another and only one sub-array can be accessed per memory request (read/write). The reduced length and cell count per local bitline within each sub-array substantially reduces the total bitline capacitance (e.g., diffusion capacitance) discharged by a single memory cell during a read operation. Reducing bitline capacitance results in faster signal development and restore time on the bitline; thus, several smaller sub-arrays can be cycled much faster than a single large array.

These and other features, and advantages, will be more clearly understood from the following detailed description taken in conjunction with the accompanying drawings. It is important to note the drawings are not intended to represent the only form of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 illustrates, in block diagram form, a data processing system implemented in accordance with one embodiment of the present invention.

DETAILED DESCRIPTION

Figure 1:
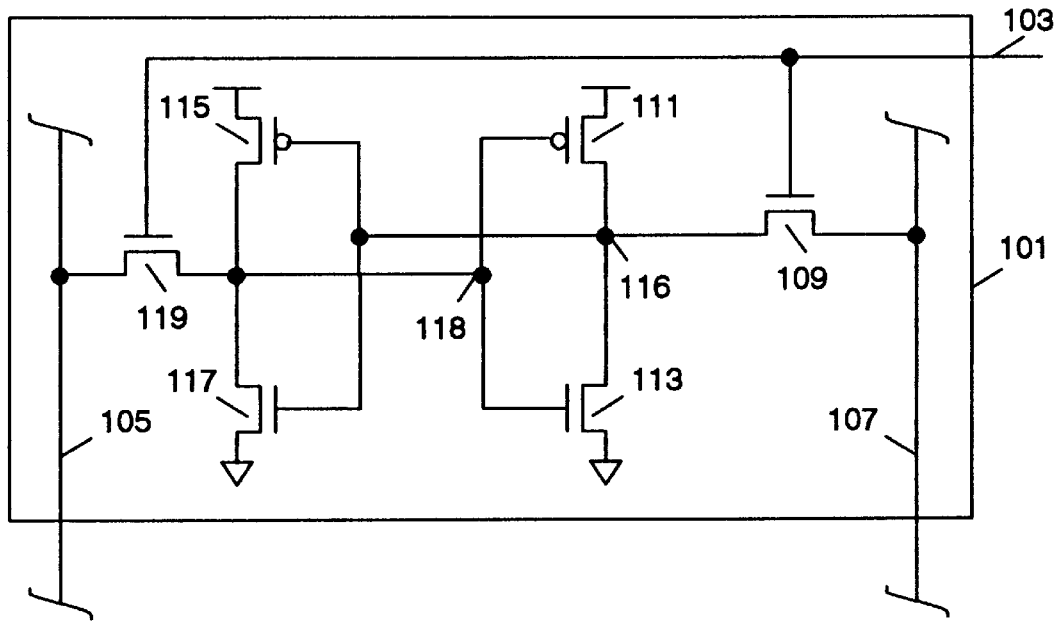
FIG. 1 illustrates a memory cell.

The present invention implements a semiconductor memory array that segments a total length of a bitline implemented therein into smaller bitline sections. The smaller bitline sections are referred to as "local" bitlines. In one embodiment of the present invention, an additional bitline is included in the memory array for every bitline that has been segmented. This additional bitline is referred to as a "global" bitline. After the memory has been segmented, the memory array effectively appears as several smaller sub-arrays. By using such a methodology, each sub-array segment has fewer cells coupled to the local bitline than a sum total of cells along the more traditional non-segmented bitline designs. Furthermore, the smaller sub-array segments, also referred to as local bitline segmentations, may be independent of one another. Furthermore, in one embodiment of the present invention, only one sub-array segment may be accessed per memory request, whether the memory request is a read or a write access.

The use of smaller sub-arrays that have fewer cells attached coupled thereto reduces a length and cell count per local bitline. Furthermore, the reduced length and cell count per local bitline within each sub-array segment substantially reduces a total bitline capacitance (principally resulting from diffusion capacitance) discharged by a single memory cell during a read access within the memory array. Reducing bitline capacitance results in faster signal development and restore time on the bitline. Thus, several smaller sub-array segments can be cycled much more quickly than a single large array.

U.S. Pat. No. 5,499,215 segments the bitline for blocks of memory cells within a memory array. However, for each segmented cell array block, a local sense amplifier and column switching means is implemented for each segmented bitline. This is a much more complex architecture than the present invention, which utilizes only one sense amplifier for each segmented bitline coupled to a global bitline.

Operation of the semiconductor memory array of the present invention will subsequently be described in greater detail.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

With reference to FIG. 1, there is shown a six transistor memory cell 101 in accordance with the present invention including a read/write line 103 and output bitlines 105 and 107. Line 103 is connected to a gate terminal of an N-channel transistor 109. Transistor 109 is connected between output bitline 107 and a common point 116 between the output terminals of a P-channel transistor 111 and an N-channel transistor 113. Transistors 111 and 113 are connected between a high logic level and a ground potential in the present example. The common point 116 is also connected to the gate terminals of a P-channel transistor 115 and an N-channel transistor 117. Transistors 115 and 117 are connected between a high logic level and a ground potential in the present example. A second common point 118 between the output terminals of transistors 115 and 117 is connected to the gate terminals of transistors 111 and 113. The common point 118 is also connected through an N-channel transistor 119 to the bitline 105. Transistor 119 has its gate terminal connected to the line 103. Transistors 111, 113, 115 and 117 are used to form a cross-coupled latch memory cell for storing data, and transistors 109 and 119 are used to obtain access to the memory cell. During a read access, for example, differential data stored within this memory cell is transferred to the attached bitline pair 105 and 107.

With respect to the implementations discussed below, bitlines 105 and 107 are local bitlines.

Figure 2:
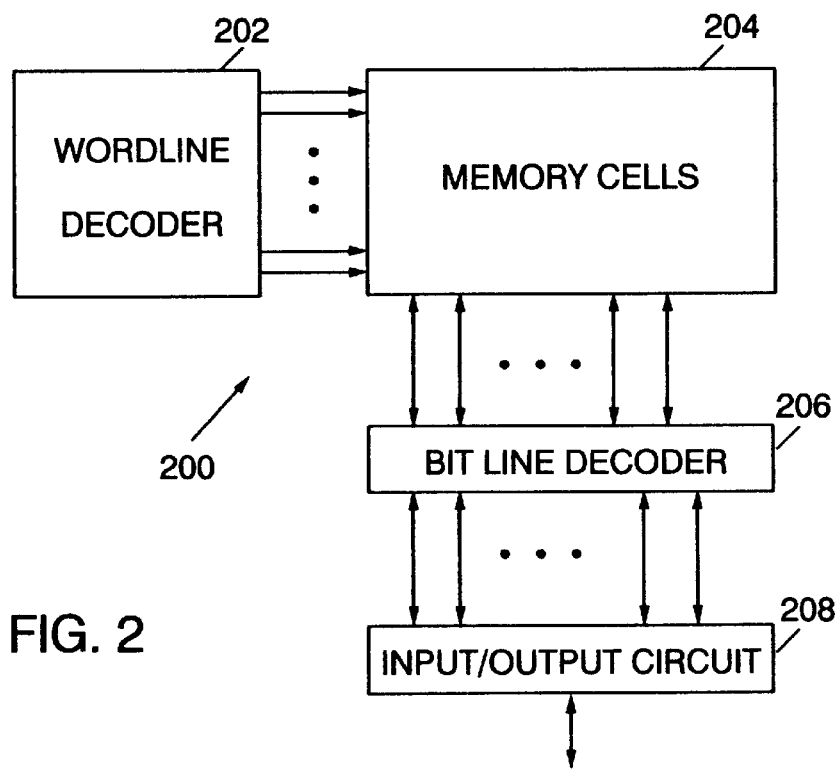
FIG. 2 illustrates, in block diagram form, a memory system in accordance with one embodiment of the present invention.

FIG. 2 illustrates a memory system 200 in accordance with one embodiment of the present invention. Note that the memory system of the present invention may be implemented in RAM 114, ROM 116, or a cache (not shown) of data processing system 100 or another memory device not illustrated in detail therein.

Memory system 200 comprises a wordline decoder 202, a plurality of memory cells 204, a bitline decoder 206, and an input/output circuit 208. Wordline decoder 202 is coupled to memory cells 204 to provide a plurality of decoded data. Additionally, bitline decoder 206 is coupled to the plurality of memory cells 204 to communicate data which has been decoded or will be decoded. Input/output circuit 208 is coupled to bitline decoder 206 to communicate data with bitline decoder 206 and to determine a value which corresponds to that data.

Figure 3:
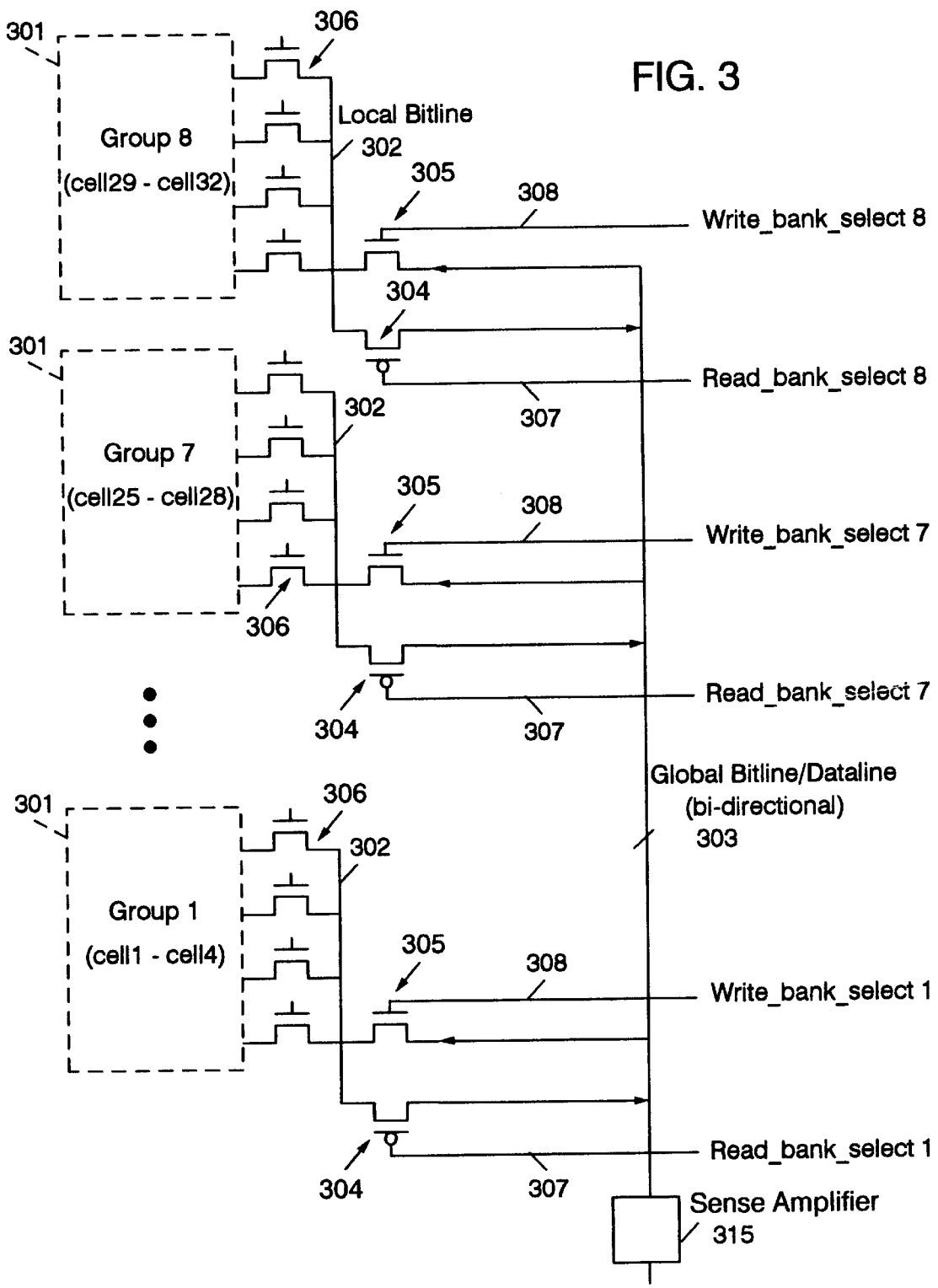
FIG. 3 illustrates, in partial circuit diagram form, a portion of a memory array implemented in accordance with one embodiment of the present invention.

Referring to FIG. 3, in the memory array configuration of the present invention, sub-arrays 301 have been generated to reduce bitline capacitance such that signals may be read and restored on a bitline quickly and with less power consumption. During operation of the memory sub-array 301, the contents of the memory within each sub-array 301 have a common path to the output of the array. The use of the global bitline 303 provides the common pathway. Furthermore, the contents of each of the many local bitlines 302 are transferred to the common global bitline 303 using a connect device 304 between each local bitline 302 and a corresponding global bitline 303. Typically, the connect device 304 is referred to as a word switch and functions to multiplex local bitlines 302 onto the global bitline 303.

In this embodiment of the present invention, true and complement bitlines are pre-charged to a high voltage level (VDD) prior to a read access operation. The connect device 304 between the local 302 and global 303 bitlines is a PMOS-type transistor such that the read access may be quickly and reliably completed. It should be noted that in alternate embodiments of the present invention, other types of devices, including NMOS transistors, may be used to connect the global 303 and local 302 bitlines.

FIG. 3 only illustrates one half of the input/output circuitry for accessing each one of memory cell groups 301. This is done for the sake of simplicity. The other side of each of groups 301 would have identical circuitry as that shown for the complement bitlines.

Also not shown for the sake of simplicity are the wordlines to each of transistors 306.

Data is written into a memory cell in any one of groups 301 from global bitline 303 through NFET 305 activated by signal write_bank_select N on line 308. The data is then presented onto local bitline 302, and will be written into one of the cells within group 301 as a function of whichever one of NFETs 306 is activated by a wordline (not shown).

Data is read from a cell onto local bitline 302 and then provided to global bitline 303 through PFET 304 as activated by line 307 receiving signal read_bank_select N.

Global bitline 303 is coupled to a differential sense amplifier circuit 315.

As can be readily appreciated, the diffusion capacitance on each of local bitlines 302 is much less than the total capacitance along a traditional bitline coupled to all memory cells within a particular column.

By assuming the internal cell load will be the same for the prior art and this invention, and assuming the wire load loading seen by both methods are the same, and further assuming the column decode-sensing load is the same, the following analysis is provided to clarify this invention:

Let N=the number of cells in a column
Let G=the number of groups of cells
Then the prior art loading is: (ignoring like loading between the two methods)
(N) Cdxfer Cdxfer=the load of the transfer device of the cell
The new invention loading is:

| | |
|---|---|
| (N/G) Cdxfer | cell group loading |
| + Cdrw | the load of the read write devices of the selected group |
| + (½) (G-1) Cdrw | the load of the read write devices of the unselected groups |

The new invention loading must be<=the prior art loading Therefore:

$$(N/G) \text{ Cdxfer}+\text{Cdrw}+(\tfrac{1}{2}) (G-1) \text{ Cdrw}<=(N) \text{ Cdxfer}$$

When G=1 this equation should evaluate to the prior art load $$(N/1) \text{ Cdxfer}+\text{Cdrw}+(\tfrac{1}{2}) (1-1) \text{ Cdrw}=(N) \text{ Cdxfer}$$

$$(N) \text{ Cdxfer}+\text{Cdrw}+\tfrac{1}{2}(0) \text{ Cdrw}=(N) \text{ Cdxfer}$$

$$(N) \text{ Cdxfer}+\text{Cdrw}=(N) \text{ Cdxfer}$$

Cdrw=0 because it would make no sense to include it for G=1
Therefore:

$$(N) \text{ Cdxfer}=(N) \text{ Cdxfer}$$

To find the improvement over the prior art a ratio of the Cdrw to Cdxfer will be used as a measurement parameter.

$$(N/G) \text{ Cdxfer}+\text{Cdrw}+(\tfrac{1}{2}) (G-1) \text{ Cdrw}<=(N) \text{ Cdxfer}$$

$$2(N/G) \text{ Cdxfer}+2\text{Cdrw}+(G-1) \text{ Cdrw}<=(2N) \text{ Cdxfer}$$

$$2(N/G) \text{ Cdxfer}+(2+G-1) \text{ Cdrw}<=(2N) \text{ Cdxfer}$$

$$(2N) \text{ Cdxfer}+G(G+1) \text{ Cdrw}<=(2NG) \text{ Cdxfer}$$

$$G(G+1) \text{ Cdrw}<=(2NG) \text{ Cdxfer}-(2N) \text{ Cdxfer}$$

$$G(G+1) \text{ Cdrw}<=(2NG-2N) \text{ Cdxfer}$$

$$\text{Cdrw}/\text{Cdxfer}<=(2NG-2N)/G(G+1)$$

$$\text{Cdrw}/\text{Cdxfer}<=2N(G-1)/G(G+1)$$

Example: Let N=1024
Let G=64

Then Cdrw/Cdxfer<=2(1024)(64-1)/64(64+1)

Cdrw/Cdxfer<=31.02

This means that the loading caused by Cdrw would have to be approximately 30 times the loading of the transfer device to get the same performance as the prior art method. For this example we have decreased the load by a factor of approximately 30, if Cdrw=Cdxfer.

It can also be observed that as G gets larger (i.e. (G-1)/(G+1) approaches unity) the ratio simplifies to:

$$\text{Cdrw}/\text{Cdxfer}<=2N/G$$

Figure 4:
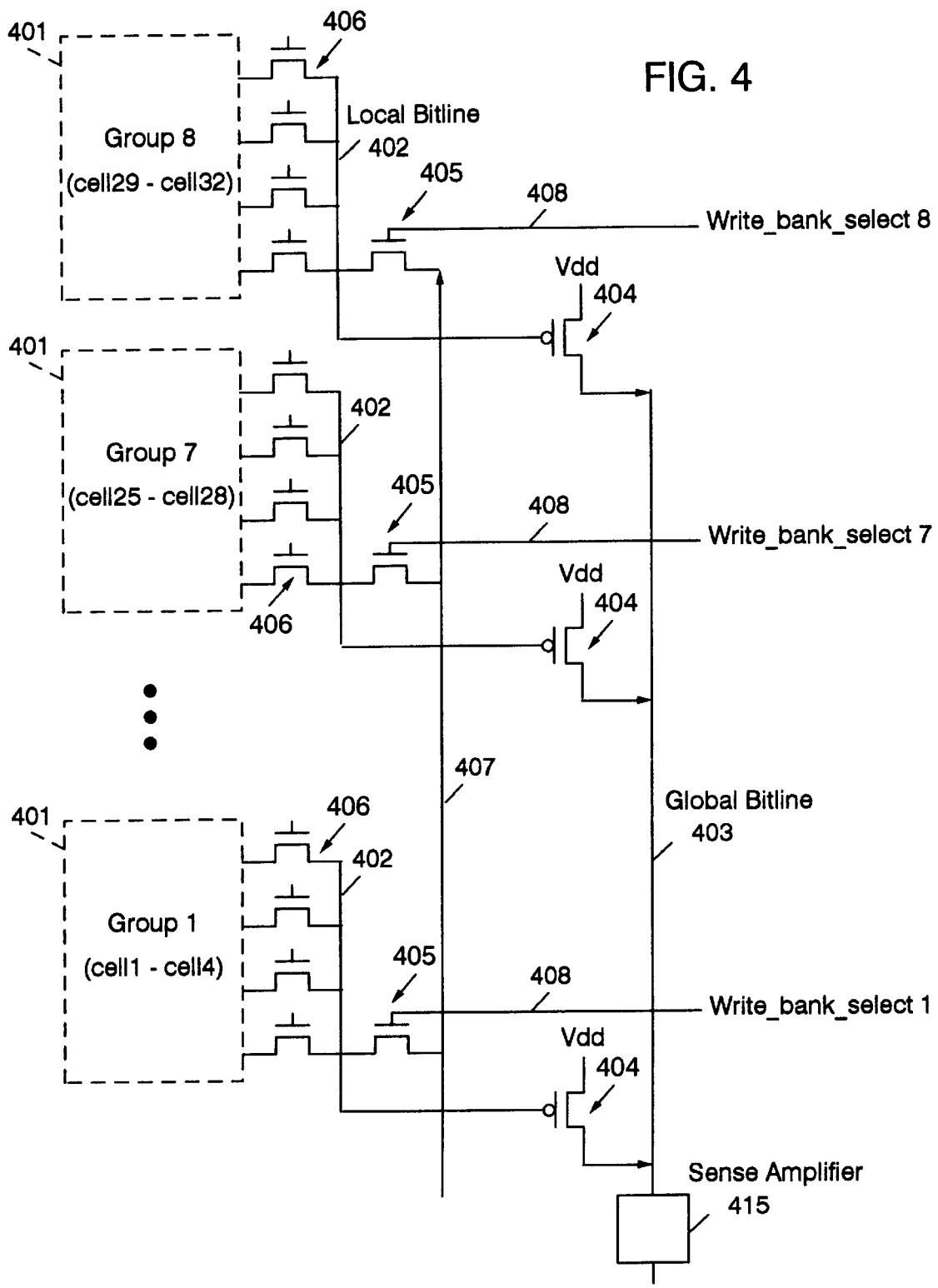
FIG. 4 illustrates, in partial circuit diagram form, an alternative embodiment of the present invention.

Referring to FIG. 4, there is illustrated an alternative embodiment of the present invention, which essentially operates in a similar fashion as the segmented bitline structure shown in FIG. 3, except that there are two separate global bitlines 403' and 407 for reading and writing data. Circuit elements 401–403 and 405–406, and 415 operate in a similar manner as their corresponding elements in FIG. 3.

The difference is that global bitline 407 provides the data to be written into a cell bank through NFET 405. Furthermore, PFET 404 is configured in a different manner so that the gate electrode of PFET 404 is coupled to the local bitline 402, however, global bitline 403 still operates to read the data from groups 401.

Referring first to FIG. 5, an example is shown of a data processing system 500 which may be used for the invention. The system has a central processing unit (CPU) 510, such as a PowerPC microprocessor ("PowerPC" is a trademark of IBM Corporation) according to "The PowerPC Architecture: A Specification for a New Family of RISC Processors", 2d edition, 1994, Cathy May, et al. Ed., which is hereby incorporated herein by reference. A more specific implementation of a PowerPC microprocessor is described in the "PowerPC 604 RISC Microprocessor User's Manual", 1994, IBM Corporation, which is hereby incorporated herein by reference. The CPU 510 is coupled to various other components by system bus 512. Read only memory ("ROM") 516 is coupled to the system bus 512 and includes a basic input-output system ("BIOS") that controls certain basic functions of the data processing system 500. Random access memory ("RAM") 514, I/O adapter 518, and communications adapter 534 are also couple to the system bus 512. I/O adapter 518 may be a small computer system interface ("SCSI") adapter that communicates with a disk storage device 520. Communications adapter 534 interconnects bus 512 with an outside network enabling the data processing system to communication with other such systems. Input/Output devices are also connected to system bus 512 via user interface adapter 522 and display adapter 536. Keyboard 524, track ball 532, mouse 526 and speaker 528 are all interconnected to bus 512 via user interface adapter 522. Display monitor 538 is connected to system bus 512 by display adapter 536. In this manner, a user is capable of inputting to the system throughout the keyboard 524, track-ball 532 or mouse 526 and receiving output from the system via speaker 528 and display 538. Additionally, an operating system such as AIX ("AIX" is a trademark of the IBM Corporation) is used to coordinate the functions of the various components shown in FIG. 5.

While there have been described herein the principles of the invention, it is to be clearly understood to those skilled in the art that this description is made by way of example only and not as a limitation to the scope of the invention. Accordingly, it is intended, by the appended claims, to cover all modifications of the invention which fall within the true spirit and scope of the invention.

What is claimed is:

1. A memory system comprising:
    N memory cells divided into a plurality of groups of M memory cells each, wherein M is less than N;
    a plurality of local bitlines each coupled to one of the plurality of groups of M memory cells; and
    a global bitline coupled to each of the plurality of local bitlines.

2. The memory system as recited in claim 1, further comprising:
    a single sense amplifier coupled to the global bitline.

3. The memory system as recited in claim 2, further comprising:
    a first switch connecting each of the plurality of local bitlines to the global bitline for providing read access to the memory cells in a group.

4. The memory system as recited in claim 3, wherein the first switch is a PFET.

5. The memory system as recited in claim 3, further comprising:
    a second switch connecting each of the plurality of local bitlines to the global bitline for providing write access to the memory cells in the group.

6. The memory cell as recited in claim 5, further comprising:
    a third switch connecting each of the memory cells in the group to its associated local bitline.

7. The memory system as recited in claim 3, further comprising:
    a second switch connecting each of the plurality of local bitlines to another global bitline for providing write access to the memory cells in the group.

8. The memory system as recited in claim 1, further comprising:
    a wordline decoder coupled to each of the memory cells; and
    a bitline decoder coupled to each of the global bitlines.

9. A data processing system comprising:
    a processor coupled via a bus to a storage system, a memory system, and an input/output system, wherein a memory system is located within one of the processor, storage system, memory system, or input/output system, the memory system comprising a plurality of memory cells divided into first and second groups of memory cells, the memory system further comprising:
    a first local bitline coupled to the memory cells in the first group;
    a second local bitline coupled to the memory cells in the second group; and
    a global bitline coupled to the first and second local bitlines.

10. The data processing system as recited in claim 9, further comprising:
    a single sense amplifier coupled to the global bitline.

11. The data processing system as recited in claim 9, further comprising:
    a first switch connecting the first local bitline to the global bitline for providing read access to the memory cells in the first group; and
    a second switch connecting the second local bitline to the global bitline for providing read access to the memory cells in the second group.

12. The data processing system as recited in claim 11, wherein the first and second switches are each a PFET.

13. The data processing system as recited in claim 11, further comprising:
    a third switch connecting the first local bitline to the global bitline for providing write access to the memory cells in the first group; and
    a fourth switch connecting the second local bitline to the global bitline for providing write access to the memory cells in the second group.

14. The data processing system as recited in claim 11, further comprising:
    a third switch connecting the first local bitline to another global bitline for providing write access to the memory cells in the first group; and
    a fourth switch connecting the second local bitline to the another global bitline for providing write access to the memory cells in the second group.

* * * * *